(12) United States Patent
Strong et al.

(10) Patent No.: US 12,400,934 B2
(45) Date of Patent: Aug. 26, 2025

(54) DIELECTRIC FILM COATING FOR THROUGH GLASS VIAS AND PLANE SURFACE ROUGHNESS MITIGATION

(71) Applicant: Intel Corporation, Santa Clara, CA (US)

(72) Inventors: Veronica Strong, Hillsboro, OR (US); Robert Jordan, Portland, OR (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 735 days.

(21) Appl. No.: 17/557,961

(22) Filed: Dec. 21, 2021

(65) Prior Publication Data

US 2023/0207332 A1    Jun. 29, 2023

(51) Int. Cl.
| | | |
|---|---|---|
| *H01L 23/48* | (2006.01) | |
| *H01L 23/15* | (2006.01) | |
| *H01L 23/498* | (2006.01) | |
| *H01G 4/012* | (2006.01) | |
| *H01G 4/224* | (2006.01) | |
| *H01G 4/33* | (2006.01) | |

(52) U.S. Cl.
CPC ............ *H01L 23/481* (2013.01); *H01L 23/15* (2013.01); *H01L 23/49816* (2013.01); *H01L 23/49827* (2013.01); *H01G 4/012* (2013.01); *H01G 4/224* (2013.01); *H01G 4/33* (2013.01)

(58) Field of Classification Search
CPC .. H01L 23/15; H01L 23/481; H01L 23/49827
See application file for complete search history.

*Primary Examiner* — David A Zarneke
(74) *Attorney, Agent, or Firm* — Schwabe, Williamson & Wyatt, P.C.

(57) ABSTRACT

Embodiments disclosed herein include electronic packages. In an embodiment, an electronic package comprises a substrate with a first surface and a second surface, where the substrate comprises glass. In an embodiment, the electronic package further comprises a via opening through the substrate, where sidewalls of the via opening have a root mean squared (RMS) surface roughness that is approximately 100 nm or greater. In an embodiment, the electronic package further comprises a liner over the sidewalls of the via opening, where an RMS surface roughness of the liner is approximately 50 nm or smaller. An electronic package may further comprise a via through the via opening.

17 Claims, 16 Drawing Sheets

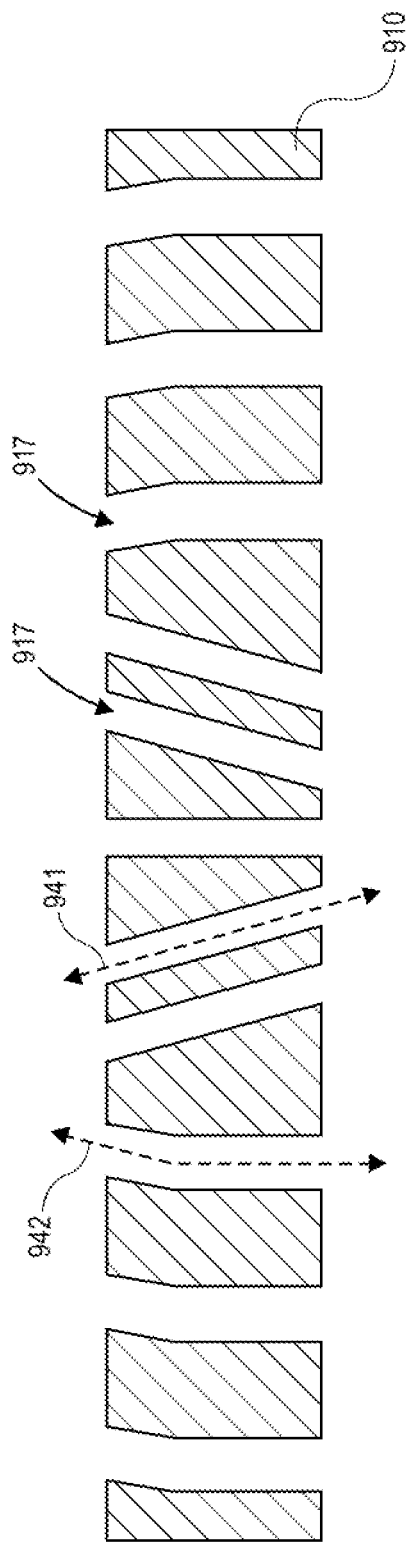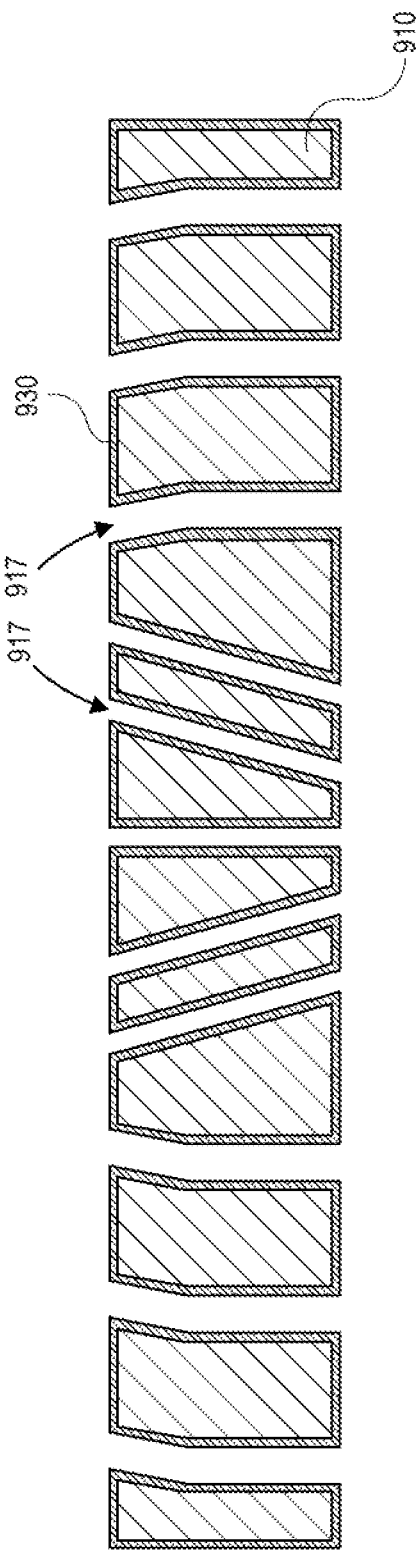
FIG. 9A
FIG. 9B

DIELECTRIC FILM COATING FOR THROUGH GLASS VIAS AND PLANE SURFACE ROUGHNESS MITIGATION

TECHNICAL FIELD

Embodiments of the present disclosure relate to electronic packages, and more particularly to electronic packages with vias and planes that are lined with a dielectric film to reduce surface roughness.

BACKGROUND

In advanced electronic packaging, some implementations are beginning to use glass cores. The glass core may be etched through with a laser assisted etching process. Generally, a laser assisted etching process involves exposing the glass core with a laser. The laser exposure changes a morphology of the glass material. The change in morphology renders the exposed regions etch selective to the unexposed regions. As such, an etching chemistry (e.g., a wet etching chemistry) can be used to selectively remove the exposed regions of the glass core.

However, the laser assisted etching process may result in rough sidewalls of the via openings in the glass core. For example, root means squared (RMS) roughness of the sidewalls of via openings may be 100 nm or greater, or even 200 nm or greater. Average roughness Ra may also be approximately 100 nm or greater. The roughness of the surfaces reduces electrical performance of the resulting conductive structure provided in the via openings.

BRIEF DESCRIPTION OF THE DRAWINGS

FIGS. 9A-9C are cross-sectional illustrations depicting a process for forming vias that are angled with a liner over the via opening sidewalls, in accordance with an embodiment.

EMBODIMENTS OF THE PRESENT DISCLOSURE

Described herein are electronic packages with vias and planes that are lined with a dielectric film to reduce surface roughness, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, laser assisted etching processes may sometimes be limited by the resulting surface roughness of the via opening sidewalls. For example, root mean squared (RMS) roughness and roughness average (Ra) may both be over 100 nm. In some instances RMS and Ra roughness may be approximately 200 nm or greater. Currently, attempts to reduce surface roughness are limited. For example, glass composition and etching chemistry may be selected to reduce surface roughness. However, even optimal glass compositions and etching chemistries still produce surface roughness values that are not compatible with some through core structures, such as vias, capacitors, and the like.

Accordingly, embodiments disclosed herein include a liner that is disposed over the sidewall surfaces of the via openings. The liner may be disposed with a conformal deposition process. As such, the liner is able to fill the topography produced by the surface roughness. In some embodiments, the liner is deposited with an atomic layer deposition (ALD) process, a chemical vapor deposition (CVD), or physical vapor deposition (PVD) process. The liner fills the topography and produces a new surface that has a lower surface roughness. For example, RMS roughness and/or Ra of the outer surface of the liner may be approximately 50 nm or less. In a particular embodiment, the RMS roughness and/or Ra may be approximately 10 nm or less. As such, subsequently deposited conductor material (e.g., to form a via) may have surfaces with low roughness. The low roughness on the conductive material results in better electrical properties.

Figure 1A:
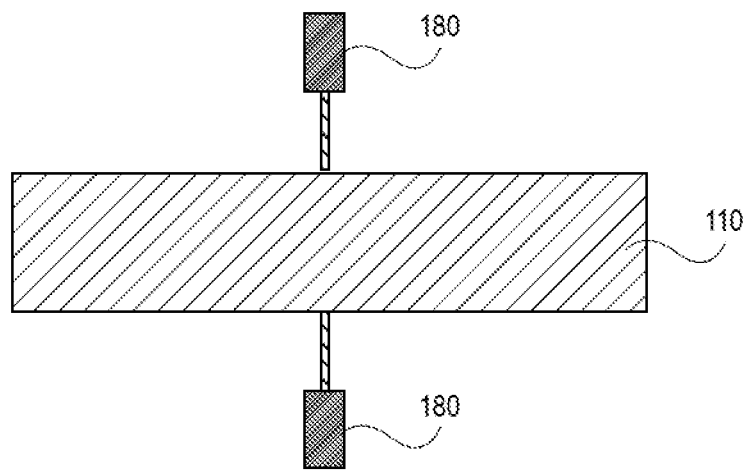
FIGS. 1A-1C are cross-sectional illustrations depicting a laser assisted etching process for forming vias through a core, in accordance with an embodiment.
Figure 1B:
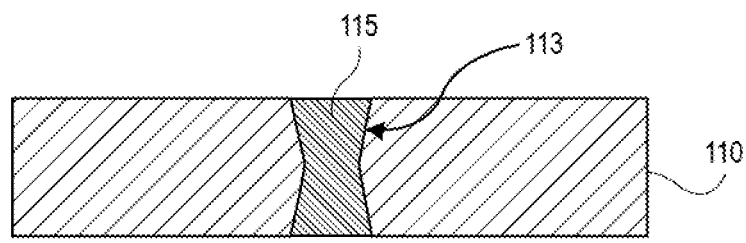
Figure 1C:
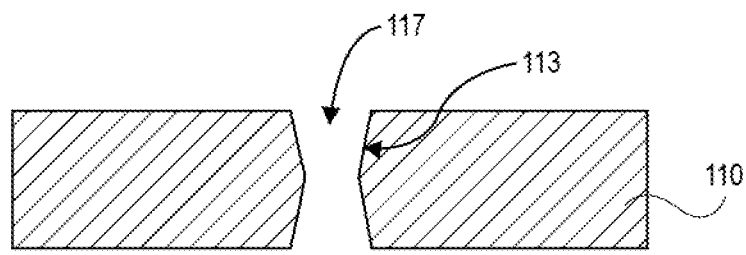
Figure 2A:
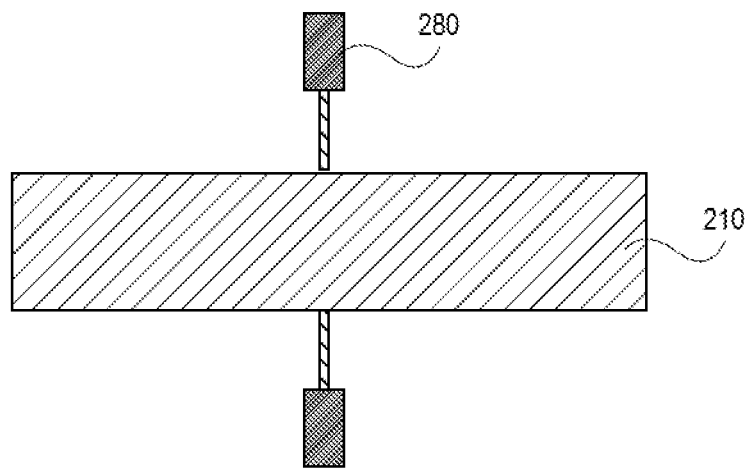
FIGS. 2A-2C are cross-sectional illustrations depicting a laser assisted etching process for forming blind vias into a core, in accordance with an embodiment.
Figure 2B:
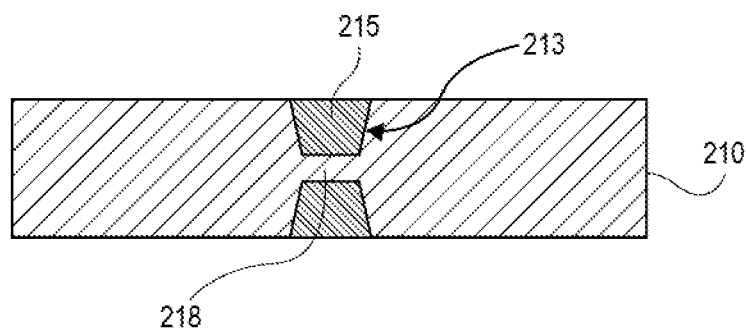
Figure 2C:
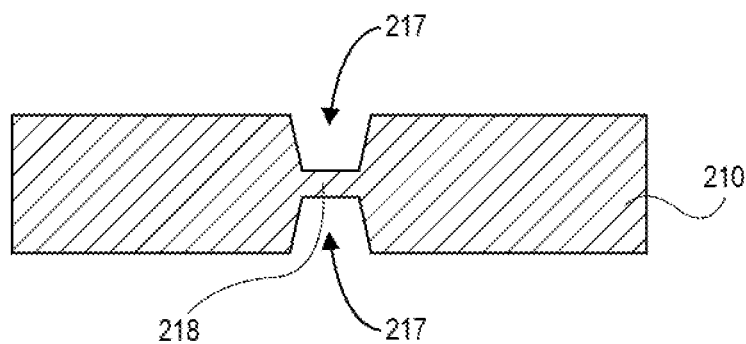
Figure 3A:
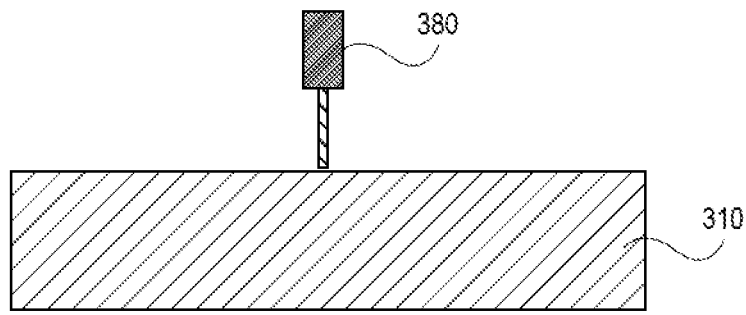
FIGS. 3A-3C are cross-sectional illustrations depicting a laser assisted etching process for forming a blind via into a core, in accordance with an embodiment.
Figure 3B:
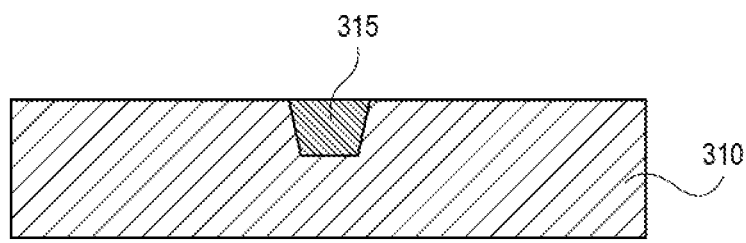
Figure 3C:
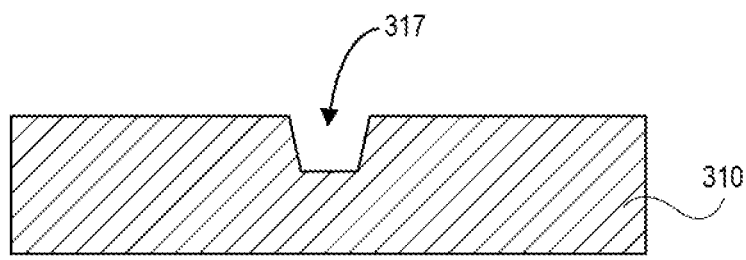

In order to provide context, FIGS. 1A-3C are three series of cross-sectional illustrations that depict processes for forming features in glass cores with laser assisted etching processes. In FIGS. 1A-1C, a through core via opening is formed. In FIGS. 2A-2C a pair of blind via openings on opposite surfaces of the core are formed. In FIGS. 3A-3C a blind via opening into the top surface of the core is formed. The openings formed in FIGS. 1A-3C can then be filled with materials (e.g., liners, conductive materials, etc.) using various plating or other deposition processes in order to manufacture vias and/or planes within a glass core. However, without the presence of a liner, the surface roughness of the sidewalls of the glass core may be too rough for some electrical features in the package.

Referring now to FIGS. 1A-1C, a series of cross-sectional illustrations depicting a process for fabricating openings in a glass core 110 is shown, in accordance with an embodiment.

Referring now to FIG. 1A, a cross-sectional illustration of a glass core 110 is shown, in accordance with an embodiment. In an embodiment, the glass core 110 may have a thickness that is between approximately 50 μm and approximately 1,000 μm. As used herein, approximately may refer to a value that is within 10% of the stated value. For example, approximately 50 μm may refer to a value between 45 μm and 55 μm. Though, it is to be appreciated that other thicknesses (larger or smaller) may also be used for the glass core 110. In an embodiment, a laser 180 is used to expose a region of the glass core 110. As shown in FIG. 1A, the exposure may be made on both sides (i.e., the top surface of the glass core 110 and the bottom surface of the glass core 110). A single laser 180 may be used, or multiple lasers may be used. In an embodiment, the laser 180 is exposed over the glass core 110 at locations where via openings are desired.

Referring now to FIG. 1B, a cross-sectional illustration of the glass core 110 after the laser 180 exposure is completed is shown, in accordance with an embodiment. As shown, the laser 180 exposure may result in the formation of exposed regions 115. In an embodiment, the glass core 110 may comprise a glass material that is able to be morphologically changed upon exposure to a laser 180. For example, the morphological change may result in the microstructure of the glass core 110 transforming to a crystalline structure from an amorphous structure. Accordingly, the exposed region 115 is shown with a different shading than the glass core 110.

In an embodiment, the laser 180 exposure may result in an exposed region 115 that has a tapered sidewall 113. In the instance where both sides of the glass core 110 are exposed (as is the case shown in FIG. 1A), the exposed region 115 may have a double tapered profile. That is, widths of the exposed region 115 at a top surface of the glass core 110 and at a bottom surface of the glass core 110 may be wider than a width at a middle of the glass core 110. In some instances, such a sidewall 113 profile may be referred to as an hourglass shaped profile.

Referring now to FIG. 1C, a cross-sectional illustration of the glass core 110 after the exposed region 115 is removed is shown, in accordance with an embodiment. In an embodiment, removal of the exposed region 115 may result in the formation of a via opening 117. The via opening 117 may pass entirely through a thickness of the glass core 110. In an embodiment, the via opening 117 may be a high aspect ratio via opening 117. As used herein a "high aspect ratio" may refer to an aspect ratio (depth:width) that is approximately 5:1 or greater, with the width being measured at a narrowest point through a thickness of the via opening 117. In other embodiments, the aspect ratio of the via opening 117 may be approximately 10:1 or greater, approximately 20:1 or greater, or approximately 50:1 or greater.

Referring now to FIGS. 2A-2C, a series of cross-sectional illustrations depicting a process for forming blind structures into a glass core 210 is shown, in accordance with an embodiment. Instead of forming an opening entirely through the glass core 210, structures that extend partially through a thickness of the core 210 are provided.

Referring now to FIG. 2A, a cross-sectional illustration of a glass core 210 is shown, in accordance with an embodiment. In an embodiment, the glass core 210 may be substantially similar to the glass core 110 described in greater detail above. For example, the glass core 210 may have a thickness between approximately 50 μm and approximately 1,000 μm. In an embodiment, lasers 280 may expose portions of the glass core 210. In an embodiment, the laser 280 exposure in FIG. 2A may be different than the laser 180 exposure in FIG. 1A. For example, an intensity or duration of the laser 280 exposure may be less than the intensity or duration of the laser 180 exposure in FIG. 1A.

Referring now to FIG. 2B, a cross-sectional illustration of the glass core 210 after exposed regions 215 are formed is shown, in accordance with an embodiment. In an embodiment, the exposed regions 215 do not extend entirely through a thickness of the glass core 210. For example, a region 218 may be provided between the top exposed region 215 and the bottom exposed region 215. In some instances, the exposed regions 215 still include tapered sidewalls 213. Since the exposed regions 215 are formed from only a single side, the sidewalls 213 may only have a single taper. That is, the exposed regions 215 may not be hourglass shaped.

Referring now to FIG. 2C, a cross-sectional illustration of the glass core 210 after the exposed regions 215 are removed to form openings 217 is shown, in accordance with an embodiment. In an embodiment, the exposed regions 215 may be removed with an etching process that is selective to the exposed regions 215 over the rest of the glass core 210. As shown, the openings 217 do not extend entirely through the glass core 210. In such embodiments, the openings 217 may be referred to as blind openings since they do not pass through the glass core 210.

Referring now to FIGS. 3A-3C, a series of cross-sectional illustrations depicting a process for forming a blind opening 317 is shown, in accordance with an embodiment.

Referring now to FIG. 3A, a cross-sectional illustration of a glass core 310 is shown, in accordance with an embodiment. In an embodiment, the glass core 310 may be substantially similar to the glass cores 110 and 210 described in greater detail above. For example, the glass core 310 may have a thickness between approximately 50 μm and approximately 1,000 μm. In an embodiment, a laser 380 may be used to expose a surface of the glass core 310. In contrast to embodiments described in greater detail above, the laser 380 exposure may only be provided on a single surface of the glass core 310.

Referring now to FIG. 3B, a cross-sectional illustration of the glass core 310 after the laser exposure to form an exposed region 315 is shown, in accordance with an embodiment. In an embodiment, the exposed region 315 may be a region that has a morphology change compared to the rest of the glass core 310. For example, the morphology change may be the transition from an amorphous structure to a crystalline structure. In an embodiment, the exposed region 315 may not extend entirely through a thickness of the glass core 310. That is, the exposed region 315 may be suitable for forming blind structures.

However, it is to be appreciated that in some embodiments, a laser 380 exposure on a single surface of the glass core 310 can be used to form an exposed region 315 that extends through an entire thickness of the glass core 310. That is, it is not necessary to use an exposure on both sides of the glass core 310 in order to form through core structures. In such an embodiment, the sidewall profile of the exposed region 315 may have a single taper, instead of the hourglass shaped taper shown in FIG. 1B.

Referring now to FIG. 3C, a cross-sectional illustration of the glass core 310 after the exposed region 315 is removed is shown, in accordance with an embodiment. In an embodiment, the removal of the exposed region 315 may result in an opening 317 being formed into the surface of the glass core 310. In an embodiment, the opening 317 may be a blind opening. In other embodiments, the opening 317 may pass entirely through a thickness of the glass core 310.

Figure 4A:
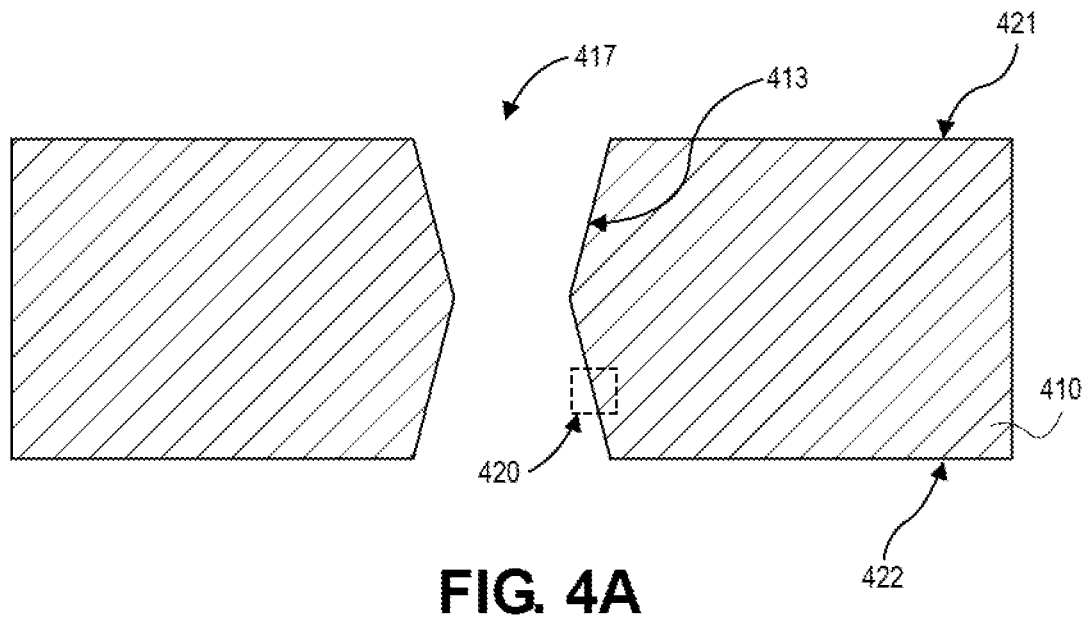
FIG. 4A is a cross-sectional illustration of a glass core with a via opening, in accordance with an embodiment.

Referring now to FIG. 4A, a cross-sectional illustration of a glass core 410 is shown, in accordance with an embodiment. In an embodiment, the glass core 410 comprises a first surface 421 and a second surface 422. A via opening 417 may be provided through a thickness of the glass core 410 from the first surface 421 to the second surface 422. In an embodiment, the sidewalls 413 of the via opening 417 may be tapered and have an hourglass shaped profile. In the illustration shown in FIG. 4A, the sidewalls 413 are shown as being relatively smooth. However, it is to be appreciated that the etching process used to form the via opening 417 may impart an undesirable surface roughness on the sidewalls 413.

Figure 4B:
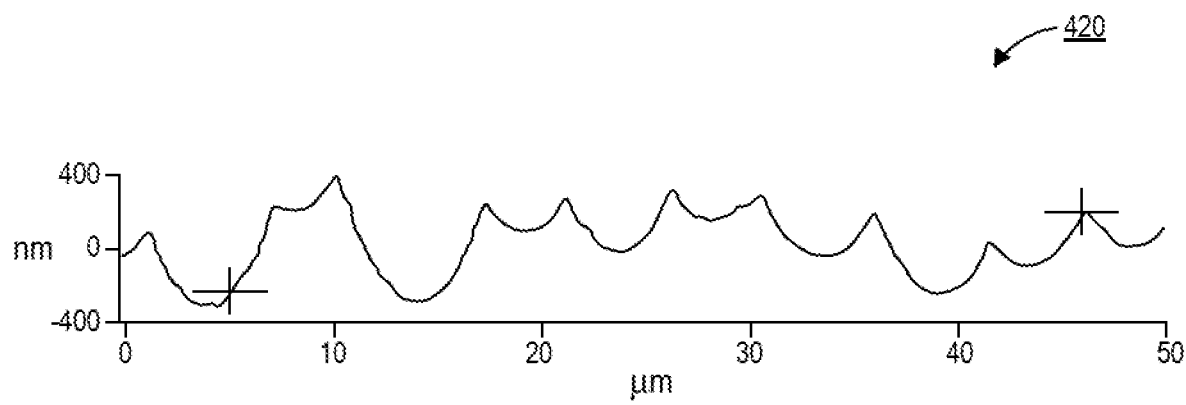
FIG. 4B is a graph of the surface roughness of the via opening in FIG. 4A provided by an atomic force microscope (AFM), in accordance with an embodiment.

For example, a plot 420 of the surface roughness on a portion of the sidewall 413 is shown in FIG. 4B. FIG. 4B is an atomic force microscope (AFM) plot of the surface roughness of the sidewall 413. As shown, the surface roughness can range between approximately-400 nm and 400 nm. Accordingly, despite appearing to be smooth, there may be a significant roughness that needs to be accounted for in order to produce high performance electronic packages.

Referring now to FIGS. 5A-5D, a series of cross-sectional illustrations depicting a process for forming a via in a core is shown, in accordance with an embodiment. In the illustrated embodiments surface roughness of the sidewalls 513 are exaggerated in order to more clearly depict certain aspect of the various embodiments described herein. That is, depending on the degree of magnification used to examine the sidewalls 513, there may not be any discernable surface roughness.

Figure 5A:
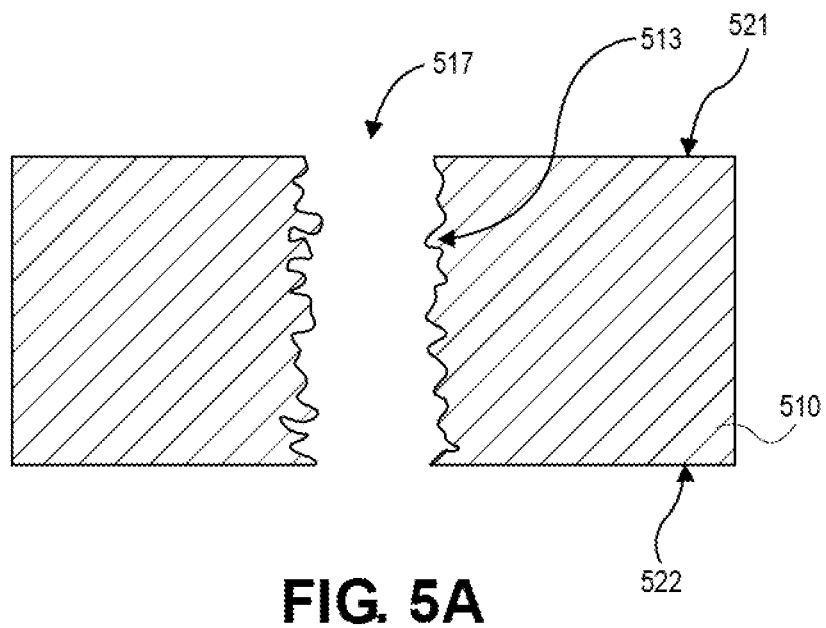
FIGS. 5A-5D are cross-sectional illustrations depicting a process for forming a via through a glass core with a liner over the sidewalls of the via opening, in accordance with an embodiment.

Referring now to FIG. 5A, a cross-sectional illustration of a core 510 is shown, in accordance with an embodiment. In an embodiment, the core 510 may be a glass core 510. The core 510 may have a thickness between approximately 50 μm and approximately 1,000 μm. In an embodiment, the core 510 has a first surface 521 (i.e., a top surface) and a second surface 522 (i.e., a bottom surface). In an embodiment, a via opening 517 is formed through a thickness of the core 510 from the first surface 521 to the second surface 522. In an embodiment, the via opening 517 may be a high aspect ratio feature. For example, the aspect ratio of the via opening 517 may be 10:1 or greater, 20:1 or greater, or 50:1 or greater. At the macro scale, the sidewalls 513 may be substantially vertical. However, at smaller scales, the sidewalls 513 may have a surface roughness, as indicated in FIG. 5A. In an embodiment, the sidewalls 513 may have an RMS roughness and/or a Ra that is approximately 100 nm or greater, or approximately 200 nm or greater.

Figure 5B:
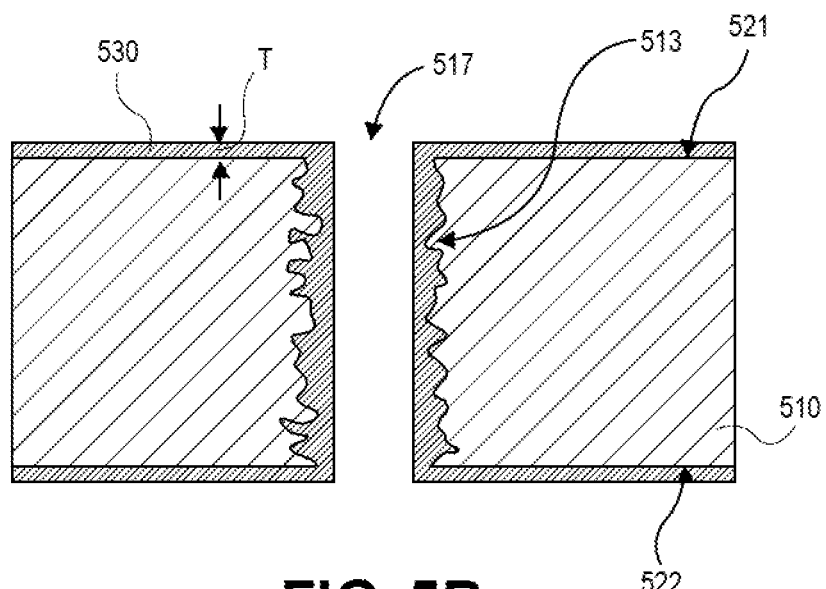

Referring now to FIG. 5B, a cross-sectional illustration of the core 510 after deposition of a liner 530 is shown, in accordance with an embodiment. The liner 530 may be deposited over the sidewalls 513, over the first surface 521, and over the second surface 522. In an embodiment, the liner 530 may be deposited with any suitable deposition process, such as ALD, CVD, PVD, spin coated and the like. In a particular embodiment, the liner 530 may be deposited with a conformal deposition process. The liner 530 may have a thickness T that is approximately two to approximately five times the average sidewall 513 surface roughness. In a particular embodiment, the liner 530 may have a thickness T that is approximately 50 nm or greater, or approximately 200 nm or greater. In an embodiment, an outer surface of the liner 530 may have a surface roughness that is less than the surface roughness of the sidewall 513. In a particular embodiment, the surface roughness of the liner 530 may be approximately 50 nm or less, or approximately 10 nm or less.

The liner 530 may be a dielectric material. For example, the liner 530 may comprise $SiO_2$, carbon doped oxides (CDOs), porous CDOs, $HfO_x$, or $Al_2O_3$. In addition to providing improved surface roughness, the liner 530 may also be a material that improves adhesion between the core 510 and a conductive feature disposed in the via opening 517 in a subsequent processing operation. In yet another embodiment, the liner 530 may provide a buffer between the coefficient of thermal expansion (CTE) difference between the core 510 and the conductive feature.

Figure 5C:
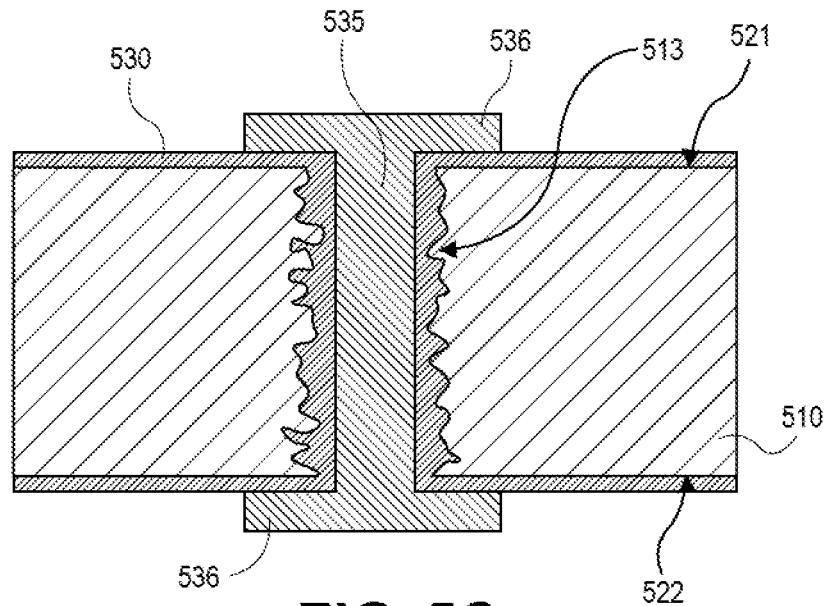

Referring now to FIG. 5C, a cross-sectional illustration of the core 510 after a via 535 is disposed in the via opening 517 is shown, in accordance with an embodiment. In an embodiment, the via 535 interfaces directly with the liner 530. That is, the via 535 may be spaced away from the surface of the core 510 by the liner 530. Also, while not shown in FIG. 5C, it is to be appreciated that a seed layer may be provided between the liner 530 and the via 535. Also, while not shown in FIG. 5C, it is to be appreciated that an adhesion layer may be provided between the liner 530 and the via 535 and/or seed layer (not shown). In some instances the seed layer is the same material as the via 535. In other embodiments, the seed layer may be a conductor with a composition that is different than the via 535. Pads 536 may be provided over the top and bottom surface of the via 535. The pads 536 may be deposited during the same deposition process used to form the via 535 in some embodiments. As shown, the surface of the pads 536 facing the core 510 may be spaced away from the core 510 by a portion of the liner 530.

Figure 5D:
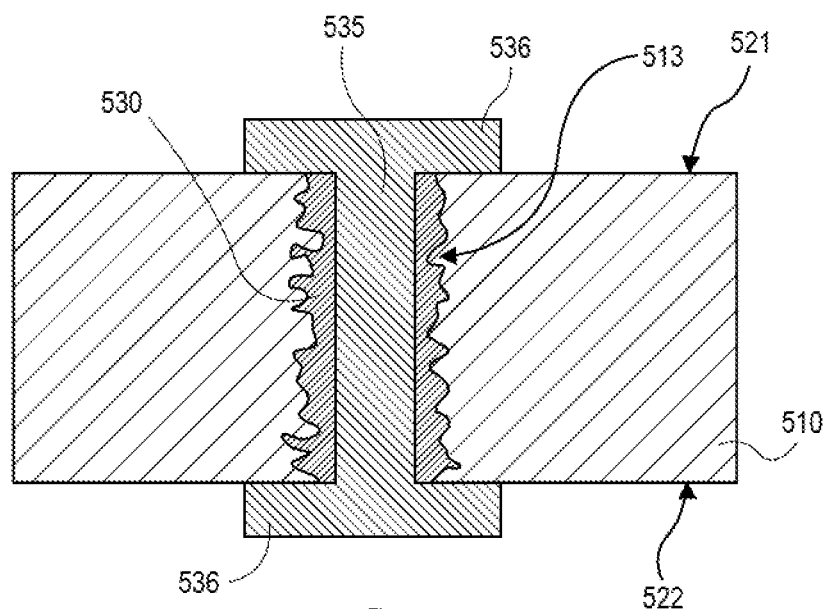

However, as shown in FIG. 5D, the liner 530 may be omitted from the first surface 521 and the second surface 522. For example, a polishing process (e.g., a chemical mechanical polishing (CMP)) may be used to remove the liner 530 from the first surface 521 and the second surface 522. The polishing process may be implemented before the deposition process used to form the via 535. In such an embodiment, the surfaces of the pads 536 that face the core 510 may be in direct contact with the core 510. Although, not shown pads 536 may be in direct contact to either a metal seed layer or adhesion layer (not liner 530). However, it is to be appreciated that a small portion of the pad 536 may contact the liner 530 at the corner where the pad 536 meets the via 535.

Figure 6:
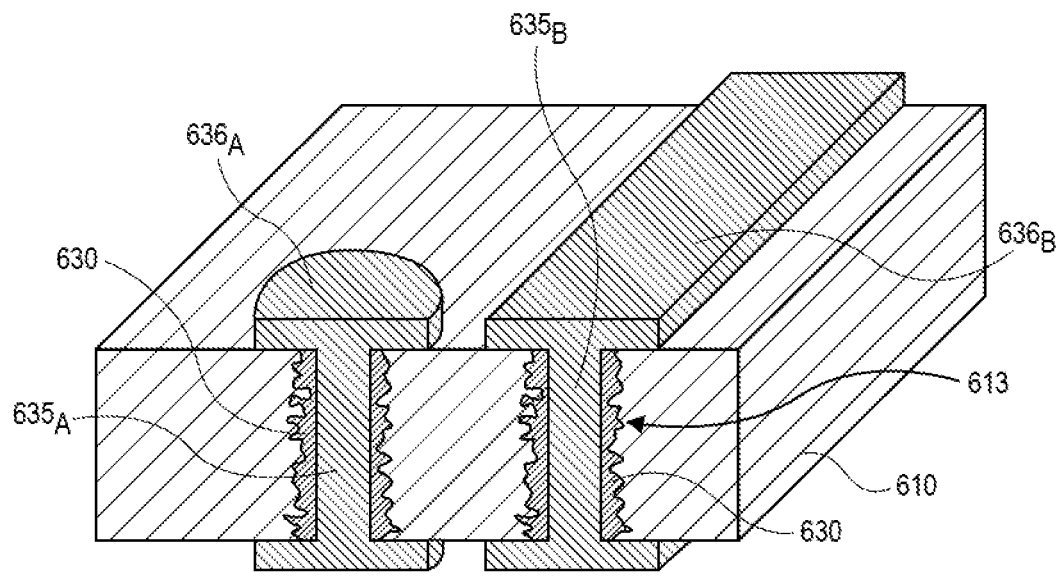
FIG. 6 is a perspective view illustration of a glass core with a via and a via plane, where sidewalls through the glass core are lined with a liner, in accordance with an embodiment.

Referring now to FIG. 6, a perspective view illustration of a core 610 is shown, in accordance with an embodiment. In an embodiment, a first via 635A and a second via 635B are shown in the core 610. The first via 635A may be a traditional via that passes through a thickness of the core 610 with a diameter that is smaller than the overlying pad 636A. The second via 635B may be considered a via plane. That is, the second via 635B extends laterally below the length of the overlying pad 636B. As such, the via 635B has a plane like structure.

However, despite their structural differences, the first via 635A and the second via 635B may share a similar cross-section, as shown at the front face of the core 610. As shown, both the first via 635A and the second via 635B have a liner 630 between the via 635 and the core 610. The liner 630 may be substantially similar to the liner 530 described in greater detail above. As such, the rough surface of the core 610 is smoothed out to a much lower surface roughness before the vias 635A and 635B are deposited into the core 610.

Referring now to FIGS. 7A-7D, a series of cross-sectional illustrations depicting a process for forming a via with a liner is shown, in accordance with an embodiment. In the illustrated embodiments surface roughness of the sidewalls 713 are exaggerated in order to more clearly depict certain aspect of the various embodiments described herein. That is, depending on the degree of magnification used to examine the sidewalls 713, there may not be any discernable surface roughness.

Figure 7A:
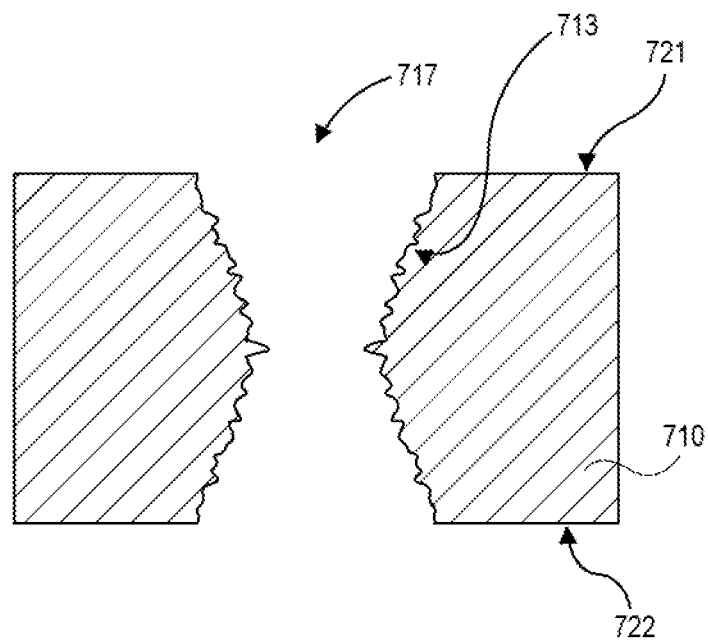
FIGS. 7A-7D are cross-sectional illustrations depicting a process for forming a via through a glass core with via opening sidewalls that are tapered and covered by a liner, in accordance with an embodiment.

Referring now to FIG. 7A, a cross-sectional illustration of a core 710 is shown, in accordance with an embodiment. In an embodiment, the core 710 may be a glass core 710. The core 710 may have a thickness between approximately 50 μm and approximately 1,000 μm. In an embodiment, the core 710 has a first surface 721 (i.e., a top surface) and a second surface 722 (i.e., a bottom surface). In an embodiment, a via opening 717 is formed through a thickness of the core 710 from the first surface 721 to the second surface 722. In an embodiment, the via opening 717 may be a high aspect ratio feature. For example, the aspect ratio of the via opening 717 may be 10:1 or greater, 20:1 or greater, or 50:1 or greater. At the macro scale, the sidewalls 713 may have a tapered profile. For example, the macro level taper in FIG. 7A may result in the formation of an hourglass shaped profile for the via opening 717. However, at smaller scales, the sidewalls 713 may have a surface roughness, as indicated in FIG. 7A. In an embodiment, the sidewalls 713 may have an RMS roughness and/or a Ra that is approximately 100 nm or greater, or approximately 200 nm or greater.

Figure 7B:
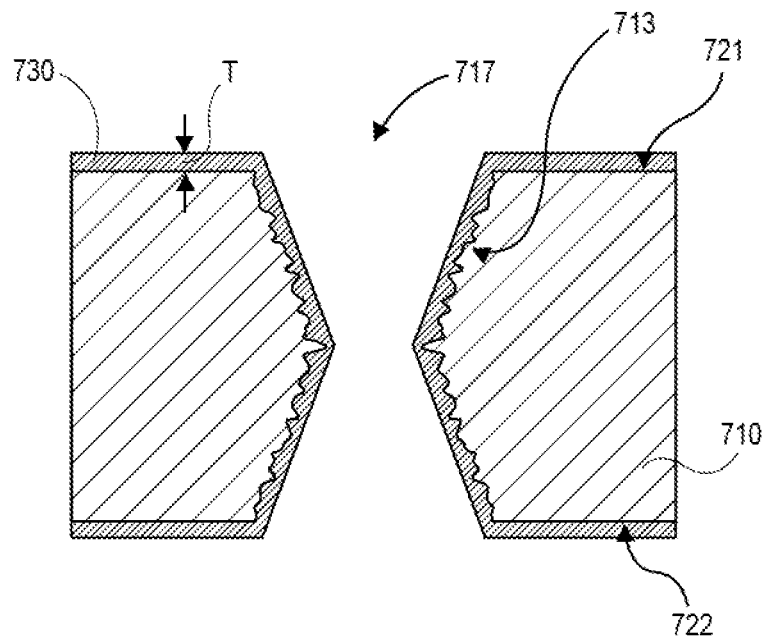

Referring now to FIG. 7B, a cross-sectional illustration of the core 710 after deposition of a liner 730 is shown, in accordance with an embodiment. The liner 730 may be deposited over the sidewalls 713, over the first surface 721, and over the second surface 722. In an embodiment, the liner 730 may be deposited with any suitable deposition process, such as ALD, CVD, PVD, spin coated, slit coated, and the like. In a particular embodiment, the liner 730 may be deposited with a conformal deposition process. The liner 730 may have a thickness T that is approximately two to approximately five times the average sidewall 713 surface roughness. In a particular embodiment, the liner 730 may have a thickness T that is approximately 50 nm or greater, or approximately 200 nm or greater. In an embodiment, an outer surface of the liner 730 may have a surface roughness that is less than the surface roughness of the sidewall 713. In a particular embodiment, the surface roughness of the liner 730 may be approximately 50 nm or less, or approximately 10 nm or less. Generally, the liner 730 may be a material and/or structure that is similar to the liner 530 described in greater detail above.

Figure 7C:
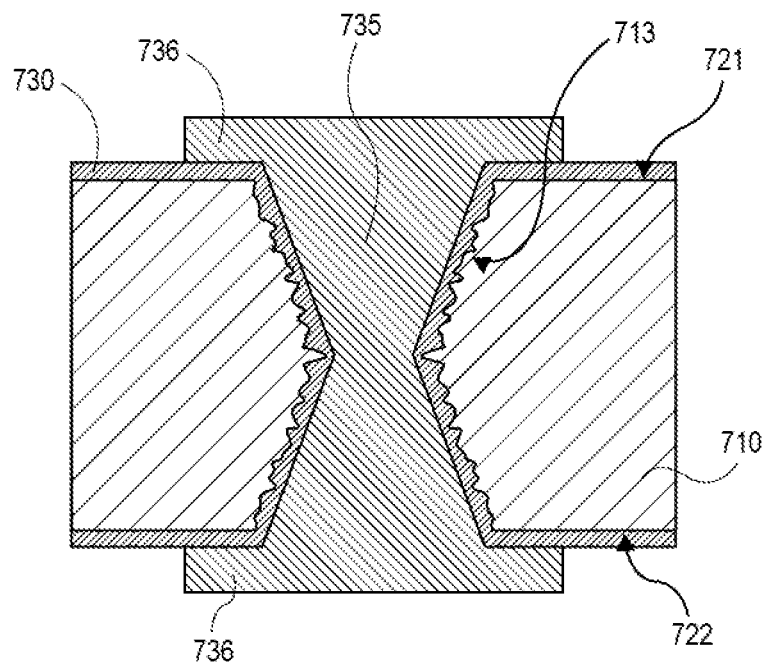

Referring now to FIG. 7C, a cross-sectional illustration of the core 710 after a via 735 is disposed in the via opening 717 is shown, in accordance with an embodiment. In an embodiment, the via 735 interfaces directly with the liner 730. That is, the via 735 may be spaced away from the surface of the core 710 by the liner 730. Also, while not shown in FIG. 5C, it is to be appreciated that a seed layer may be provided between the liner 730 and the via 735. In some instances the seed layer is the same material as the via 735. In other embodiments, the seed layer may be a conductor with a composition that is different than the via 735. Pads 736 may be provided over the top and bottom surface of the via 735. The pads 736 may be deposited during the same deposition process used to form the via 735 in some embodiments. As shown, the surface of the pads 736 facing the core 710 may be spaced away from the core 710 by a portion of the liner 730.

Figure 7D:
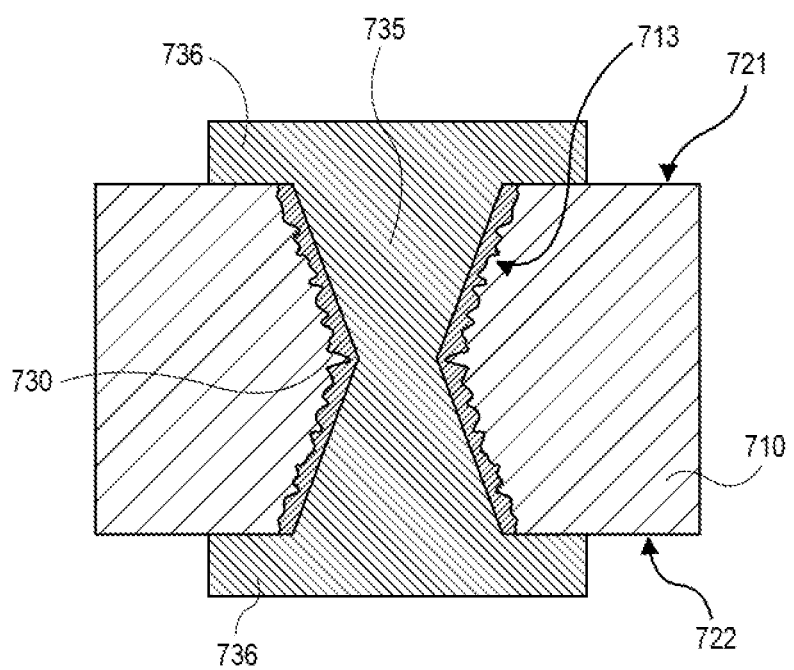

However, as shown in FIG. 7D, the liner 730 may be omitted from the first surface 721 and the second surface 722. For example, a polishing process (e.g., CMP) may be used to remove the liner 730 from the first surface 721 and the second surface 722. The polishing process may be implemented before the deposition process used to form the via 735. In such an embodiment, the surfaces of the pads 736 that face the core 710 may be in direct contact with the core 710. However, it is to be appreciated that a small portion of the pad 736 may contact the liner 730 at the corner where the pad 736 meets the via 735. Additionally, in some embodiments, a metal seed layer (not shown) may be provided between the pad 736 and the core 710.

Referring now to FIGS. 8A-8D, a series of cross-sectional illustrations depicting a process for forming a blind via with a liner is shown, in accordance with an embodiment. In the illustrated embodiments surface roughness of the sidewalls 813 and bottom surface 814 are exaggerated in order to more clearly depict certain aspect of the various embodiments described herein. That is, depending on the degree of magnification used to examine the sidewalls 813 and bottom surface 814, there may not be any discernable surface roughness.

Figure 8A:
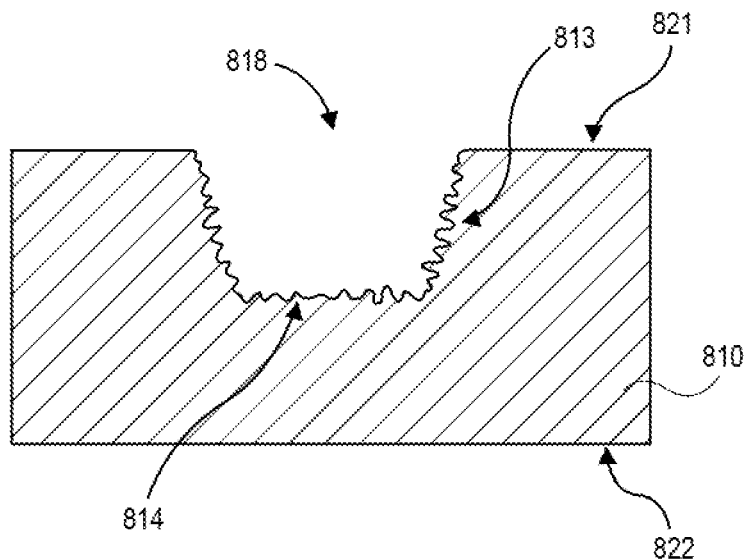
FIGS. 8A-8D are cross-sectional illustrations depicting a process for forming a blind via into a glass core with via opening sidewalls that are tapered and covered by a liner, in accordance with an embodiment.

Referring now to FIG. 8A, a cross-sectional illustration of a core 810 is shown, in accordance with an embodiment. In an embodiment, the core 810 may be substantially similar to the glass cores described in greater detail above. In an embodiment, the core 810 has a first surface 821 (i.e., a top surface) and a second surface 822 (i.e., a bottom surface). In an embodiment, a blind via opening 818 is formed into, but not through, a thickness of the core 810. At the macro scale, the sidewalls 813 may have a tapered profile. For example, the macro level taper in FIG. 8A may result in the formation of a trapezoidal shaped profile for the blind via opening 818. However, at smaller scales, the sidewalls 813 and bottom surface 814 may have a surface roughness, as indicated in FIG. 8A. In an embodiment, the sidewalls 813 and bottom surface 814 may have an RMS roughness and/or a Ra that is approximately 100 nm or greater, or approximately 200 nm or greater.

Figure 8B:
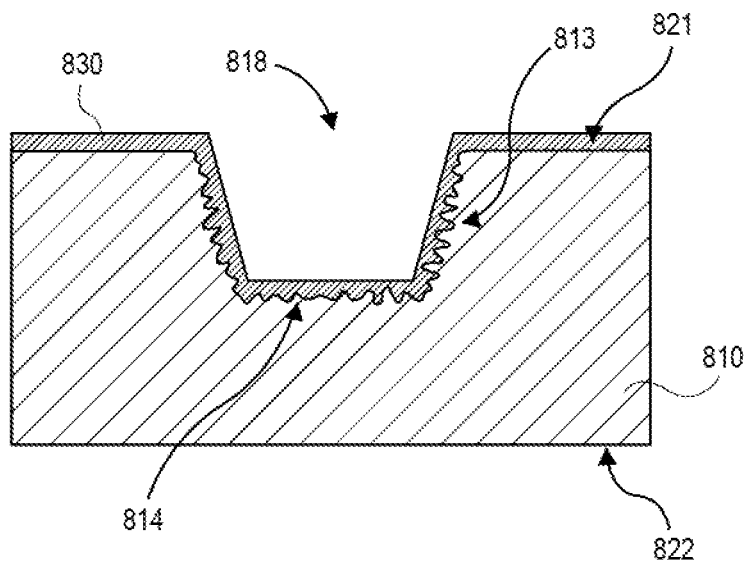

Referring now to FIG. 8B, a cross-sectional illustration of the core 810 after deposition of a liner 830 is shown, in accordance with an embodiment. The liner 830 may be deposited over the sidewalls 813, the bottom surface 814, and the first surface 821. In an embodiment, the liner 830 may be deposited with any suitable deposition process, such as ALD, CVD, PVD, and the like. In a particular embodiment, the liner 830 may have a material and/or structure that is similar to the liners 530 and 730 described in greater detail above.

Figure 8C:
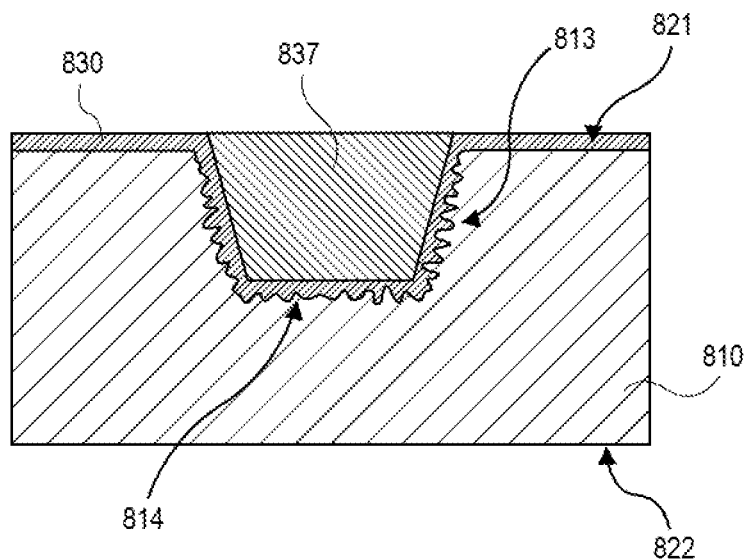

Referring now to FIG. 8C, a cross-sectional illustration of the core 810 after a blind via 837 is disposed in the via opening 818 is shown, in accordance with an embodiment. In an embodiment, the blind via 837 interfaces directly with the liner 830. That is, the blind via 837 may be spaced away from the surface of the core 810 by the liner 830. Also, while not shown in FIG. 8C, it is to be appreciated that a seed layer may be provided between the liner 830 and the blind via 837. The seed lay may be substantially similar to seed layers described in greater detail above.

Figure 8D:
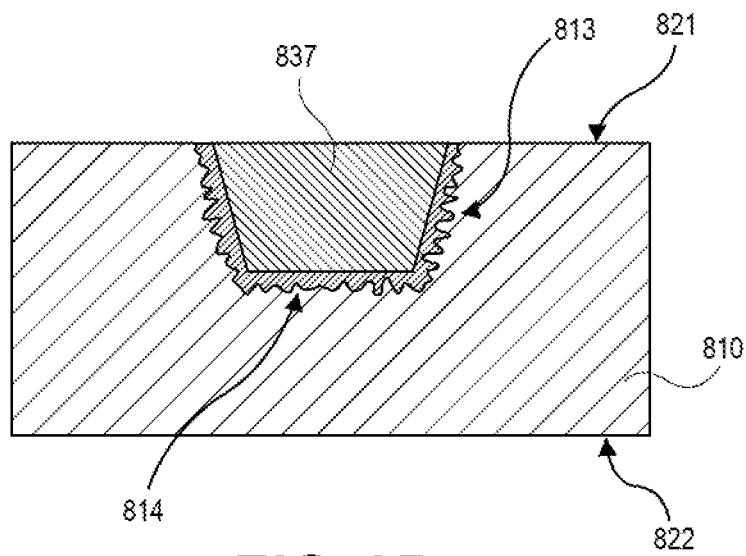

As shown in FIG. 8D, the liner 830 may be omitted from the first surface 821. For example, a polishing process (e.g., CMP) may be used to remove the liner 830 from the first surface 821. The polishing process may be implemented before the deposition process used to form the blind via 837.

In the Figures described above, the via openings all had centerlines that were substantially vertical through the thickness of the core. However, embodiments are not limited to such architectures. For example, as shown in FIGS. 9A-9C, the centerlines of the via openings 917 may be angled or partially angled.

Referring now to FIG. 9A, a cross-sectional illustration of a core 910 is shown, in accordance with an embodiment. In an embodiment, a plurality of via openings 917 are formed through a thickness of the core 910. In an embodiment, centerlines 942 and 941 of the via openings 917 may not be entirely vertical. For example, centerlines 942 have an angled top portion that is connected to a vertical bottom portion. Centerlines 941 may be angled through the entire thickness of the core 910. In FIG. 9A, the sidewalls of the via openings 917 are shown as being substantially smooth for simplicity. However, it is to be appreciated that the sidewalls of the via openings 917 may have significant surface roughness values, similar to embodiments described in greater detail above.

Referring now to FIG. 9B, a cross-sectional illustration of the core 910 after a liner 930 is disposed over the exposed surfaces of the core 910 is shown, in accordance with an embodiment. In an embodiment, the liner 930 may be substantially similar to the liners described in greater detail above. Generally, the liner 930 fills the topography of roughened sidewalls of the via openings 917, and the liner 930 has a smooth outer surface (e.g., 50 nm RMS or less, or 10 nm RMS or less).

Figure 9C:
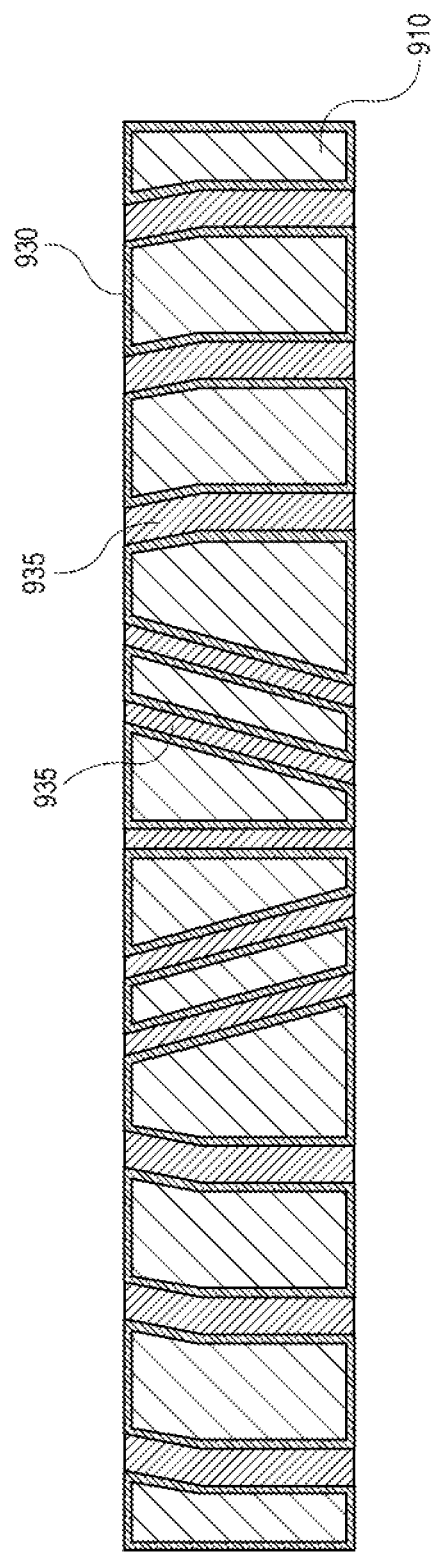

Referring now to FIG. 9C, a cross-sectional illustration of the core 910 after vias 935 are disposed into the via openings 917 is shown, in accordance with an embodiment. As shown, the vias 935 are spaced away from the core 910 by the liner 930. In some instances, a seed layer (not shown) may also be between the via 935 and the core 910.

Figure 10:
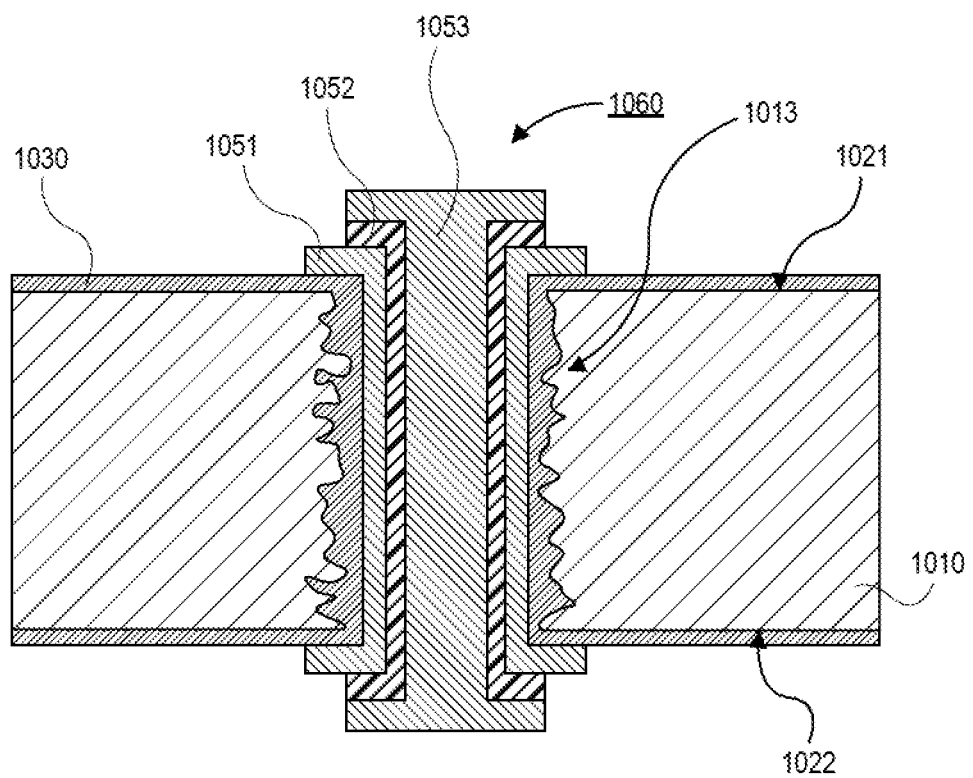
FIG. 10 is a cross-sectional illustration of a trench capacitor with a liner over the via opening sidewalls, in accordance with an embodiment.

Referring now to FIG. 10, a cross-sectional illustration of a trench capacitor 1060 is shown, in accordance with an embodiment. In an embodiment, the trench capacitor 1060 is fabricated in a via opening through a core 1010. As illustrated, sidewalls 1013 of the via opening may have a relatively high roughness. While shown at the macro level in FIG. 10, it is to be appreciated that the roughness is exaggerated in FIG. 10 in order to illustrate aspects of certain embodiments. The surface roughness of surface 1013 may be substantially similar to surface roughness values of the patterned core surfaces described in greater detail above.

In an embodiment, a liner 1030 is disposed over the first surface 1021 of the core 1010, the second surface 1022 of the core 1010, and the sidewall surfaces 1013 of the via opening. The liner 1030 may be substantially similar in structure and composition as liners described in greater detail above. Generally, the liner 1030 conforms to the roughness of the sidewalls 1013 and provides a smooth outer surface onto which the first electrode 1051 is formed. The first electrode 1051 may comprise copper or the like. In an embodiment, a capacitor dielectric 1052 may be provided over the first electrode 1051. The capacitor dielectric 1052 may be a high-k dielectric material. As used herein, high-k materials may refer to materials that have a dielectric constant equal to silicon dioxide ($SiO_2$) or greater. In an embodiment, a second electrode 1053 may be disposed over the capacitor dielectric 1052. As such, a capacitor 1060 is formed by the first electrode 1051, the capacitor dielectric 1052, and the second electrode 1053. The smooth surface provided by the liner 1030 allows for high break down voltage embedded capacitors. Particularly, the smooth surface enables ultra-thin high-k dielectric layers. The smooth surface reduces the risk for leakage and potential low voltage dielectric breakdown. In the illustrated embodiment, a single via structure is shown. However, it is to be appreciated that the capacitor 1060 may also be formed as a via plane, a blind via, or a plurality of adjacent vias.

Figure 11:
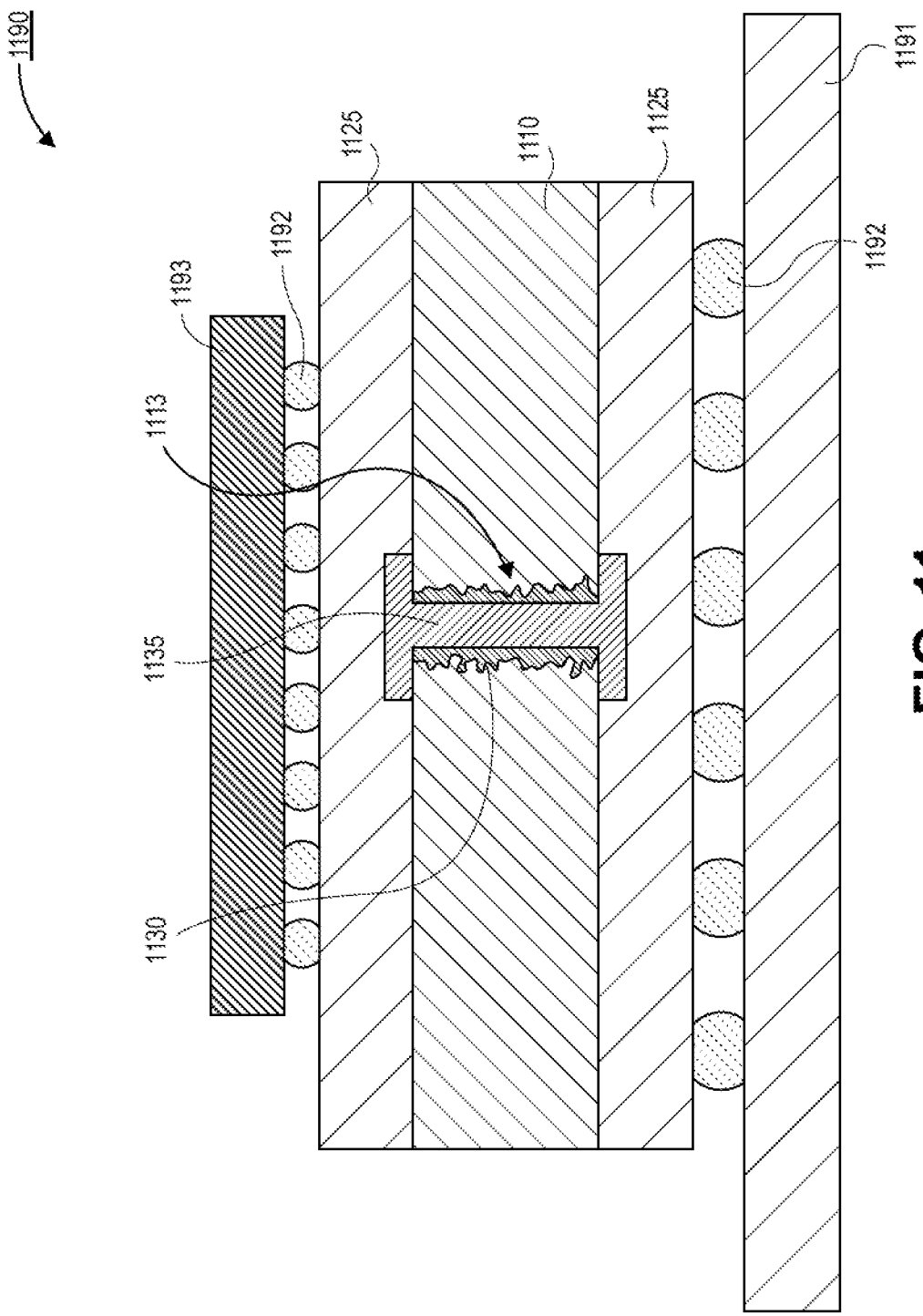
FIG. 11 is a cross-sectional illustration of an electronic system with a package substrate with a glass core and a liner over sidewalls of via openings, in accordance with an embodiment.

Referring now to FIG. 11, a cross-sectional illustration of an electronic system 1190 is shown, in accordance with an embodiment. In an embodiment, the electronic system 1190 comprises a board 1191, such as a printed circuit board (PCB). The board 1191 may be coupled to a package substrate by interconnects 1192. The interconnects 1192 may be solder balls, sockets, or the like. In an embodiment, the package substrate comprises a core 1110 and buildup layers 1125 above and below the core 1110. The core 1110 may be a glass core, similar to the glass cores described above. In an embodiment, a liner 1130 may line a rough sidewall 1113 of the core 1110. A via 1135 may be provided over the liner 1130. The liner 1130 may be substantially similar to any of the liners described in greater detail above. In an embodiment, a die 1193 is coupled to the top buildup layer 1125 by interconnects 1192. The interconnects 1192 may be any suitable first level interconnect (FLI). In an embodiment, the die 1193 may be a processor, a graphics processor, a memory die, or any other computational die.

Figure 12:
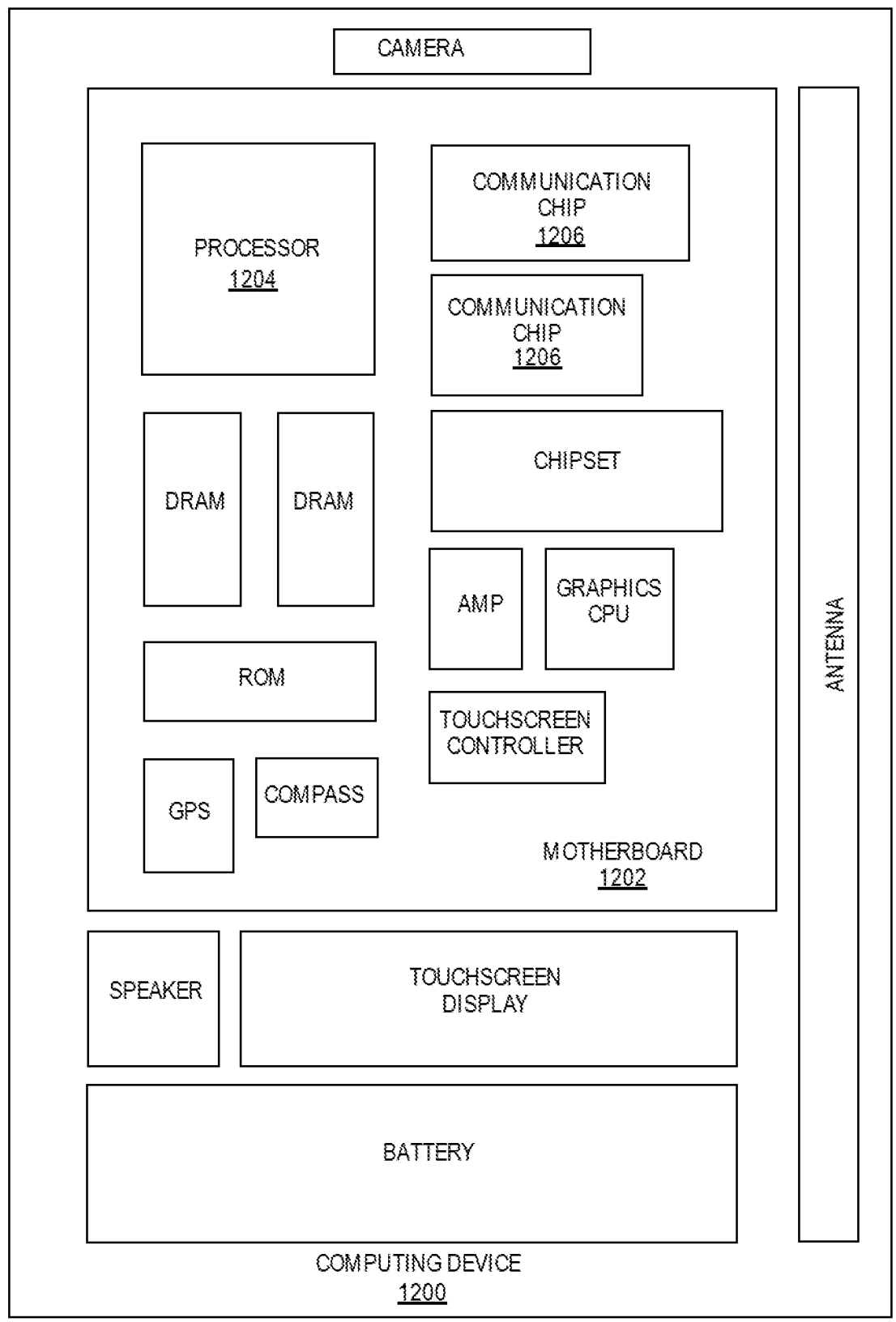
FIG. 12 is a schematic of a computing device built in accordance with an embodiment.

FIG. 12 illustrates a computing device 1200 in accordance with one implementation of the invention. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die packaged within the processor 1204. In some implementations of the invention, the integrated circuit die of the processor may be part of an electronic package that comprises a glass core with a via opening that is lined with a liner and filled with a via, in accordance with embodiments described herein. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1206. In accordance with another implementation of the invention, the integrated circuit die of the communication chip may be part of an electronic package that comprises a glass core with a via opening that is lined with a liner and filled with a via, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a substrate with a first surface and a second surface, wherein the substrate comprises glass; a via opening through the substrate, wherein sidewalls of the via opening have a root mean squared (RMS) surface roughness that is approximately 100 nm or greater; a liner over the sidewalls of the via opening, wherein an RMS surface roughness of the liner is approximately 50 nm or smaller; and a via through the via opening.

Example 2: the electronic package of Example 1, wherein the RMS surface roughness of the liner is approximately 10 nm or smaller.

Example 3: the electronic package of Example 1 or Example 2, wherein a thickness of the liner is up to approximately five times the RMS surface roughness of the sidewalls of the via opening.

Example 4: the electronic package of Example 3, wherein the thickness of the liner is approximately 200 nm or greater.

Example 5: the electronic package of Examples 1-4, wherein the sidewalls of the via opening are substantially vertical.

Example 6: the electronic package of Examples 1-4, wherein the sidewalls of the via opening are tapered.

Example 7: the electronic package of Example 6, wherein the sidewalls of the via opening have an hourglass shaped profile.

Example 8: the electronic package of Examples 1-7, wherein the liner is a dielectric material.

Example 9: the electronic package of Example 8, wherein the liner comprises $SiO_2$, carbon doped oxides (CDO), porous CDOs, $HfO_x$, $Al_2O_3$, or polymer.

Example 10: the electronic package of Examples 1-9, further comprising: a seed layer between the via and the liner.

Example 11: the electronic package of Examples 1-10, wherein the liner is further provided over the first surface and the second surface of the substrate.

Example 12: the electronic package of Examples 1-11, wherein the via opening passes entirely through a thickness of the substrate from the first surface to the second surface.

Example 13: the electronic package of Examples 1-12, wherein the via opening is a blind feature that does not pass entirely through a thickness of the substrate.

Example 14: the electronic package of Examples 1-13, wherein the via is a via plane.

Example 15: an electronic package, comprising: a substrate with a first surface and a second surface, wherein the substrate comprises glass; a via opening through a thickness of the substrate from the first surface to the second surface; a liner over sidewalls of the via opening; a first conductor over the liner; a dielectric layer over the first conductor; and a second conductor over the dielectric layer.

Example 16: the electronic package of Example 15, wherein a root mean squared (RMS) surface roughness of the sidewalls of the via opening is approximately 100 nm or greater.

Example 17: the electronic package of Example 16, wherein a thickness of the liner is approximately 100 nm or greater.

Example 18: the electronic package of Examples 15-17, wherein an RMS surface roughness of the liner is approximately 10 nm or less.

Example 19: the electronic package of Examples 15-18, wherein the first conductor, the dielectric layer, and the second conductor form a capacitor.

Example 20: the electronic package of Examples 15-19, wherein the sidewalls of the via opening are substantially vertical.

Example 21: the electronic package of Examples 15-20, wherein a thickness of the dielectric layer is approximately 100 nm or less.

Example 22: the electronic package of Examples 15-21, wherein the second conductor has an I-shaped cross-section.

Example 23: an electronic system, comprising: a board; a package substrate coupled to the board, wherein the package substrate, comprises: a substrate with a first surface and a second surface, wherein the substrate comprises glass; a via opening through the substrate, wherein sidewalls of the via opening have a rout mean squared (RMS) surface roughness that is approximately 100 nm or greater; a liner over the sidewalls of the via opening, wherein an RMS surface roughness of the liner is approximately 50 nm or smaller; and a via through the via opening; and a die coupled to the package substrate.

Example 24: the electronic system of Example 23, wherein the RMS surface roughness of the liner is approximately 10 nm or smaller.

Example 25: the electronic system of Example 23 or Example 24, wherein the liner comprises $SiO_2$, carbon doped oxides (CDO), porous CDOs, $HfO_x$, $Al_2O_3$, or polymer.

What is claimed is:

1. An electronic package, comprising:
   a substrate with a first surface and a second surface, wherein the substrate comprises glass;
   a via opening through the substrate, wherein sidewalls of the via opening have a root mean squared (RMS) surface roughness that is approximately 100 nm or greater;
   a liner over the sidewalls of the via opening, wherein an RMS surface roughness of the liner is approximately 50 nm or smaller; and
   a via through the via opening.

2. The electronic package of claim 1, wherein the RMS surface roughness of the liner is approximately 10 nm or smaller.

3. The electronic package of claim 1, wherein a thickness of the liner is up to approximately five times the RMS surface roughness of the sidewalls of the via opening.

4. The electronic package of claim 3, wherein the thickness of the liner is approximately 200 nm or greater.

5. The electronic package of claim 1, wherein the sidewalls of the via opening are substantially vertical.

6. The electronic package of claim 1, wherein the sidewalls of the via opening are tapered.

7. The electronic package of claim 6, wherein the sidewalls of the via opening have an hourglass shaped profile.

8. The electronic package of claim 1, wherein the liner is a dielectric material.

9. The electronic package of claim 8, wherein the liner comprises $SiO_2$, carbon doped oxides (CDO), porous CDOs, $HfO_x$, $Al_2O_3$, or polymer.

10. The electronic package of claim 1, further comprising:
    a seed layer between the via and the liner.

11. The electronic package of claim 1, wherein the liner is further provided over the first surface and the second surface of the substrate.

12. The electronic package of claim 1, wherein the via opening passes entirely through a thickness of the substrate from the first surface to the second surface.

13. The electronic package of claim 1, wherein the via opening is a blind feature that does not pass entirely through a thickness of the substrate.

14. The electronic package of claim 1, wherein the via is a via plane.

15. An electronic system, comprising:
    a board;
    a package substrate coupled to the board, wherein the package substrate, comprises:
      a substrate with a first surface and a second surface, wherein the substrate comprises glass;
      a via opening through the substrate, wherein sidewalls of the via opening have a rout mean squared (RMS) surface roughness that is approximately 100 nm or greater;
      a liner over the sidewalls of the via opening, wherein an RMS surface roughness of the liner is approximately 50 nm or smaller; and
      a via through the via opening; and
    a die coupled to the package substrate.

16. The electronic system of claim 15, wherein the RMS surface roughness of the liner is approximately 10 nm or smaller.

17. The electronic system of claim 15, wherein the liner comprises $SiO_2$, carbon doped oxides (CDO), porous CDOs, $HfO_x$, $Al_2O_3$, or polymer.

* * * * *